United States Patent
Seliger et al.

(10) Patent No.: US 7,375,032 B2
(45) Date of Patent: May 20, 2008

(54) SEMICONDUCTOR SUBSTRATE THINNING METHOD FOR MANUFACTURING THINNED DIE

(75) Inventors: Frank Seliger, Zeitz (DE); Matthias Lehr, Dresden (DE); Marcel Wieland, Radebeul (DE); Lothar Mergili, Dresden (DE); Frank Kuechenmeister, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 341 days.

(21) Appl. No.: 11/124,874

(22) Filed: May 9, 2005

(65) Prior Publication Data

US 2006/0068595 A1 Mar. 30, 2006

(30) Foreign Application Priority Data

Sep. 30, 2004 (DE) .................. 10 2004 047 730

(51) Int. Cl.
*H01L 21/311* (2006.01)
(52) U.S. Cl. ............ 438/695; 438/411; 257/734; 257/735; 257/736
(58) Field of Classification Search ........ 438/612, 438/613, 614, 459, 977, 737
See application file for complete search history.

(56) References Cited

U.S. PATENT DOCUMENTS

| | | | | |
|---|---|---|---|---|
| 5,903,058 | A * | 5/1999 | Akram | 257/778 |
| 5,943,597 | A * | 8/1999 | Kleffner et al. | 438/613 |
| 6,107,180 | A * | 8/2000 | Munroe et al. | 438/613 |
| 6,121,058 | A * | 9/2000 | Shell et al. | 438/4 |
| 6,162,652 | A * | 12/2000 | Dass et al. | 438/18 |
| 6,258,705 | B1 * | 7/2001 | Chien et al. | 438/614 |
| 6,312,830 | B1 * | 11/2001 | Li et al. | 428/624 |
| 6,426,281 | B1 * | 7/2002 | Lin et al. | 438/612 |
| 6,426,556 | B1 * | 7/2002 | Lin | 257/738 |
| 6,426,562 | B2 * | 7/2002 | Farnworth | 257/779 |
| 6,462,426 | B1 * | 10/2002 | Kelkar et al. | 257/781 |
| 6,538,323 | B1 * | 3/2003 | Sakata et al. | 257/737 |
| 6,593,220 | B1 * | 7/2003 | Yu et al. | 438/612 |
| 6,610,595 | B2 * | 8/2003 | Seshan | 438/652 |
| 6,846,719 | B2 * | 1/2005 | Tong et al. | 438/411 |
| 6,936,923 | B2 * | 8/2005 | Lin et al. | 257/750 |
| 6,962,867 | B2 * | 11/2005 | Jackson et al. | 438/622 |
| 6,992,001 | B1 * | 1/2006 | Lin | 438/612 |
| 7,081,404 | B2 * | 7/2006 | Jan et al. | 438/613 |
| 7,119,002 | B2 * | 10/2006 | Lin | 438/612 |
| 7,189,927 | B2 * | 3/2007 | Sakuyama | 174/261 |
| 7,199,036 | B2 * | 4/2007 | Chan et al. | 438/613 |
| 2002/0036337 | A1 * | 3/2002 | Yi et al. | 257/613 |
| 2002/0068425 | A1 * | 6/2002 | Chen et al. | 438/613 |

(Continued)

FOREIGN PATENT DOCUMENTS

EP 1 351 298 A2 3/2003

(Continued)

*Primary Examiner*—Hsien Ming Lee
*Assistant Examiner*—Ankush K Singal
(74) *Attorney, Agent, or Firm*—Williams, Morgan & Amerson, P.C.

(57) ABSTRACT

In a method according to the present invention, a substrate thinning process is performed on a bumped substrate prior to the ultimate solder reflow process to heal bump defects caused by the substrate thinning process. Concurrently, the risk of substrate breakage is reduced compared to the prior art process since the number of process steps, requiring handling of thinned substrates, is reduced.

22 Claims, 6 Drawing Sheets

U.S. PATENT DOCUMENTS

| | | | |
|---|---|---|---|
| 2002/0075031 A1* | 6/2002 | Degani | 324/765 |
| 2002/0079576 A1* | 6/2002 | Seshan | 257/737 |
| 2002/0185733 A1* | 12/2002 | Chow et al. | 257/737 |
| 2003/0121958 A1* | 7/2003 | Ratificar et al. | 228/246 |
| 2003/0157438 A1* | 8/2003 | Tong et al. | 430/314 |
| 2003/0162362 A1* | 8/2003 | Tong et al. | 438/411 |
| 2004/0016752 A1* | 1/2004 | Ratificar et al. | 219/679 |
| 2004/0040855 A1* | 3/2004 | Batinovich | 205/123 |
| 2004/0072387 A1* | 4/2004 | Hong et al. | 438/108 |
| 2004/0104261 A1* | 6/2004 | Sterrett et al. | 228/180.22 |
| 2004/0124171 A1* | 7/2004 | Wu | 216/11 |
| 2004/0166661 A1* | 8/2004 | Lei | 438/614 |
| 2004/0175657 A1* | 9/2004 | Danovitch et al. | 430/311 |
| 2004/0253804 A1* | 12/2004 | Beica et al. | 438/614 |
| 2005/0014355 A1* | 1/2005 | Chan et al. | 438/613 |
| 2005/0023328 A1* | 2/2005 | Stipp et al. | 228/207 |
| 2005/0176231 A1* | 8/2005 | Shei et al. | 438/612 |
| 2005/0176234 A1* | 8/2005 | Shei et al. | 438/613 |
| 2005/0253261 A1* | 11/2005 | Farnworth | 257/734 |
| 2006/0009023 A1* | 1/2006 | Nair et al. | 438/614 |
| 2006/0011703 A1* | 1/2006 | Arita et al. | 228/56.3 |
| 2006/0270108 A1* | 11/2006 | Farnworth et al. | 438/106 |
| 2007/0102815 A1* | 5/2007 | Kaufmann et al. | 257/737 |
| 2007/0114663 A1* | 5/2007 | Brown et al. | 257/737 |

FOREIGN PATENT DOCUMENTS

WO     WO 96/02122     1/1996

* cited by examiner

SEMICONDUCTOR SUBSTRATE THINNING METHOD FOR MANUFACTURING THINNED DIE

BACKGROUND OF THE INVENTION

1. Field of the Invention

The present invention relates to the field of the fabrication of semiconductor devices, and, more particularly, to a method of manufacturing thinned die for flip-chip applications by employing a substrate thinning process to reduce the thickness of substrates bearing, for instance, a plurality of die for forming integrated circuits.

2. Description of the Related Art

There is an ongoing trend in the semiconductor industry to increase the size of substrates employed in the manufacturing process. Currently, 400 mm substrates are intended for industrial application for large scale production technologies, for example, for memory or microprocessor devices. To ensure safe and readily practicable substrate handling during the entire manufacturing process, the thickness of the larger substrates is also increased. Thus, 400 mm substrates typically have a thickness of approximately 800 µm, whereas, for example, 200 mm substrates typically have a thickness of approximately 725 µm. On the other hand, the number of applications requiring thinned die is growing, for example, smart card, multi-chip-module, stacked die module and high power module applications, wherein, additionally, a tendency for a reduced target thickness of the die for the different applications is discernible. For smart card applications, for example, a desired target thickness of 20 µm is on the horizon.

Usage of thinned die offers a plurality of advantages. Ultra-thin die, e.g., 20 µm or less thick, exhibit a high flexibility so that they appear to be appropriate for future smart card applications having a desired total thickness of 250 µm or less. Due to the high flexibility, ultra-thin chips are able to withstand the mechanical stress exerted from carrying and using in everyday life. For smart card applications, typically, thinned die having a thickness in the range of 20-200 µm may be utilized. Further, ultra-thin die may be employed in stacked die packages to achieve a higher number of transistors per unit volume of a module. Such high transistor density modules are appropriate for low power applications, for example, in stacked memories. For high power applications, heat removal in stacked die packages is not sufficient. For stacked memory applications, die having a typical thickness in the range of approximately 40-100 µm are used. For high power applications, the employment of thinned die is also advantageous since heat removal from the backside of a chip may be improved due to the reduced heat resistance of thinned and polished chips. In high power applications, the thinned die typically have a thickness in the range of approximately 50-400 µm.

In addition to the improvement of the thermal behavior of thinned chips, the electrical performance of an integrated circuit on a thinned chip may be improved. In particular, in silicon-on-insulator (SOI) devices, the electrical performance gain may be more relevant than the improvement of the thermal behavior, since, in SOI devices, the thermal resistance of a backside contact is increased compared to a bulk substrate device, due to the pure thermal conductivity of the insulator layer.

Figure 1A:
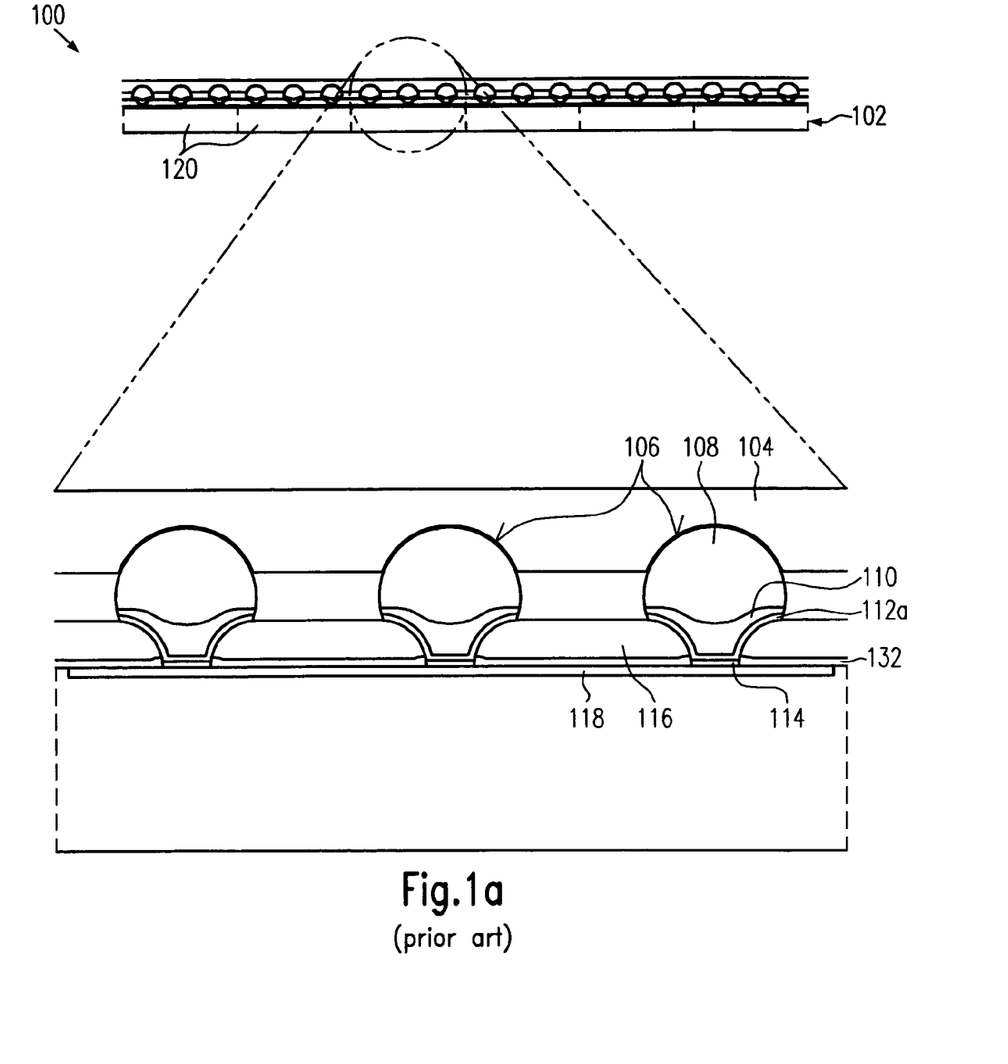

Thin die are also employed for wire bonding and flip-chip bonding. Substrate thinning, however, is a crucial step in the packaging related processes. In particular, grinding of substrates provided with solder bumps is a major concern in manufacturing thin die for flip-chip bond applications since, during backside grinding, the bumps disposed on the front side are also subjected to mechanical load and consequently may be damaged. To illustrate the challenge of grinding of bumped substrates 100, a substrate 102 with solder bumps 106 thereon is depicted in FIG. 1a. A substrate 102 may bear a plurality of die 120 comprising an integrated circuit 118. The integrated circuit 118 is connected to several bond pads 114. Between the bond pads 114, a polyimide passivation layer 116 is formed on the substrate surface. On the bond pads 114 and on parts of the polyimide passivation layer 116, an under bump metallization (UBM) layer 112a is disposed. On the UBM layer 112a, a solder bump 106 is formed over the bond pads 114. The solder bump 106 may comprise a base portion 110 and a solder portion 108. Bump protection tape 104 may be laminated on the bumped substrate surface to protect the substrate 102 during processing of the backside of the substrate.

The die generally may be thinned at the substrate level or at the die level, i.e., prior to or after dicing. Thinning on the substrate level allows processing of the plurality of die of an entire substrate 102 by a common process. Consequently, thinning at the substrate level achieves a low total thickness variation (TTV). Furthermore, thinning at the substrate level provides the throughput required for large scale production. Although, in the so-called "dicing before grinding" (DBG) process the substrate 102 is subjected to a dicing step before grinding, the method pertains to the grinding at substrate level category since the cutting is performed only to a certain depth somewhat deeper than the final desired die thickness so that the grinding step is performed mainly on the entire backside of the substrate 102 until the substrate 102 is separated into individual die at the end of the thinning process. In that phase, the individual die may be held in position by a protection tape 104 adhered to the substrate/die front side. After the grinding process, the die may be placed in a die frame before removing the front side protection tape 104.

Thinning at the die level, on the other hand, reduces the risk of substrate breakage (related to thinned substrate handling) and of die defects caused by chipping in the dicing process since the region of the die (edge of the backside) that is typically affected by chipping may be removed in the subsequent thinning process.

The substrate thinning process may be performed by any method appropriate for removing the substrate material, for example, mechanical methods, chemical methods or combinations thereof, such as coarse/fine grinding, dry polishing, etching or chemical mechanical polishing (CMP). In general, different methods are combined to provide the thinned die with the desired backside surface quality by a cost- and time-effective process. The substrate thinning processes, in particular, substrate grinding processes, are well known in the semiconductor industry and, thus, are herein not described in detail. An overview of characteristics of the employed substrate thinning methods, however, is provided in the following to illustrate the present application.

Typically, substrate grinding is performed by subjecting a rotating substrate 102 to a treatment by means of rotating cup wheel grinding tools. Coarse grinding using a cup wheel tool with a coarse grid may be utilized to remove most of the amount to be removed from the substrate 102 (such as 90% or more). This process, however, leaves a rather rough backside surface and causes severe crystal damage in a region close to the ground backside surface(sub-surface) reaching to a depth of approximately 5-30 µm (depending on the characteristic of the grinding tools used). Thus, typically, fine grinding using a cup wheel tool with a fine grid is subsequently performed to reduce the backside surface roughness and the sub-surface crystal damage. Since the fine-grind step is based on the same principle, there is still crystal damage present in the backside sub-surface (extending approximately 1-10 μm). The sub-surface damage is related to a plurality of tiny cracks created in the grinding process. These tiny cracks, however, introduce stress and dramatically reduce the stability of the substrate 102 and heighten the bowing of the substrate 102. Thus, to improve the strength of thinned die, a stress relief step removing or at least reducing the sub-surface damage may be performed subsequently. Dry polishing, chemical mechanical polishing (CMP), dry (plasma) etching and wet etching may be employed for stress reduction by removing the sub-surface damage. Wet etching may be performed rather by a spin etch process than a bath etch process to achieve a better final thickness uniformity. Acidic compounds containing HF and $HNO_3$ may be applied to the damaged region. Advantageously, an etching process using HF provides a clean surface so that, compared to mechanical polishing operations, an additional cleaning step may be avoided.

Due to the fact that etching exerts, contrary to grinding, substantially no mechanical stress on the substrate 102 during the removal process, etching is the favorite process for forming ultra-thin die to reduce the risk of breakage during the thinning process. Despite this, there is no strict lower limit for mechanical thinning of substrates 102 so that, for example, well-adapted grinding processes have been employed to achieve a final thickness of the die of 20 μm. Since, furthermore, grinding methods, in general, exhibit a higher removal rate, grinding is widely used for substrate thinning.

Die thinning is performed on completely processed semiconductor substrates 102, wherein approximately 500 or more process steps may be performed prior to the thinning step. Thus, any severe substrate damage, e.g., breakage of the substrate 102, involves substantial costs. Thus, the choice of an appropriate thinning process is important for the cost-effectiveness of the die thinning process. On the other hand, since the risk of damage for thinned substrates 102 during handling and processing is high, the cost-effectiveness of the thinning process is further determined by the point of integration into the conventional semiconductor manufacturing process. To provide an overview of the possible points of integration, a typical process sequence of a solder bumping process, comprising the steps of forming a polyimide passivation layer 116, forming solder bumps 106, reflowing the bump material, performing a wafer-level functional test, dicing and assembling, is described in the following.

Completely processed semiconductor substrates 102 when leaving the wafer facility are provided with a passivation layer, e.g., silicon oxide or silicon nitride, and exposed (aluminum, gold, copper) bond pads 114 to electrically connect the devices, e.g., by wire bonding. To provide the die with bumps 106, required for flip-chip bonding, the processed substrate 102 is, as a first step, subjected to a further passivation process to form a polyimide layer 116 on the substrate 102 exposing the bond pads 114.

Polyimide materials exhibit a good thermal stability (<450° C.), a low coefficient of thermal expansion, excellent dielectric properties, mechanical toughness and chemical resistance. Thus, the polyimide passivation layer 116 may serve as a buffer for mechanical stress and a protection layer. Polyimide layers, for example, may be utilized to shield from α particles which may be radiated from the solder bump material. While the required thickness of the polyimide layer for α particle protection is approximately 40 μm, for a stress buffer functionality, a thickness of 4-6 μm is sufficient. Polyimide layers may further be employed as insulation layers in bond pad redistribution applications, wherein a peripheral bond pad arrangement may be redistributed to, for example, an area array distribution to allow higher chip I/O counts or reduce the bump pitch requirements.

Typically, the substrate surface is cleaned and pre-processed by a primer treatment to improve the adhesion of the polyimide layer. Some polyimides have built-in adhesion promoters to eliminate an additional primer treatment step. The polyimide layer is typically spin-coated (possibly in a two-step process, to achieve the required thickness) on the substrate 102 to assure a good uniformity, and subsequently cured, typically in a multi-step curing process. Hot plates are commonly used for an initial bake after application in a temperature range of approximately 50-150° C. Final curing is usually performed in a furnace or programmable oven in a temperature range of approximately 280-350° C.

Polyimide layers are commonly patterned by wet etch processes, dry etch processes, laser ablation or by the usage of a photo-definable polyimide. Photo-definable polyimides reduce the number of process steps required to form a polyimide pattern and allow patterning of relatively fine features. Dry etch techniques are typically employed to form very fine features with high aspect ratios, whereas wet etch processing is typically used to pattern coarse features. For a currently achieved bond pad size of approximately 100 μm, the wet etch process is still applicable. The spin-coated polyimide layer is partially cured and a positive resist is deposited thereon, baked, imaged and developed. The developer simultaneously wet etches the underlying polyimide layer in the imaged regions. After a water rinse, the resist is stripped using a liquid resist stripper. The patterned polyimide is then completely cured to accomplish the imidization process and to remove residual solvents.

Patterned polyimide layers may also be formed by screen or stencil print techniques requiring only a print and a cure step to form a patterned polyimide passivation layer 116. These print techniques allow deposition of polyimide layers of a thickness of more than 40 μm in a single print step but are restricted to coarse patterns with bond pad openings greater than about 125 μm. For smaller feature sizes, the entire wafer may be coated by screen printing and, after cure, the bond pad lands may be reopened by using laser ablation techniques.

Independent of the chosen polyimide passivation process, polyimide passivation 116 requires a lot of substrate handling steps which are, in general, carried out by substrate-handling robots integrated into the polyimide line.

After the formation of the polyimide passivation layer 116, the substrates 102 are transferred from the polyimide line to the bumping facility. The solder bumps 106 may be formed by electro/electroless plating, screen printing or an evaporative bump process. The evaporative bump process is a well-established, widely-used solder bump process, based on evaporation of metal through a mask to form the bumps 106 over the bond pads 114 of the die. In the evaporative bump process, a so-called shadow mask having openings with tapered sidewalls is clamped onto the substrate 102 so that the mask openings are aligned to the bond pads 114 to be bumped. The taper of the shadow mask, which is typically formed of molybdenum, facilitates the removal of the mask after solder bump 106 formation.

After mask alignment, an argon sputter etch is employed to remove die bond pad oxides and to ensure low electrical contact resistance. Subsequently, an under-bump metallization (UBM) layer 112a comprising chrome/chrome-copper/copper/gold sub-layers is deposited through the shadow mask on the exposed regions of the substrate 102, i.e., on portions of the bond pads 114 and on the sidewalls of the polyimide passivation layer 116. This layer acts as an adhesion layer, provides an electrically conductive diffusion barrier and establishes a good mechanical base 110 for the solder bump 106. The next deposition step of the evaporative bump process is to evaporate lead, followed by tin, to form the bulk of the bumps 106. After the final deposition step, the shadow mask is removed. In the next step, the bumps 106 are reflowed to homogenize the lead/tin solder and to allow the tin to form an intermetallic compound, for example, with a copper sub-layer of the UBM layer 112a to provide the required adhesion between the die and the bumps 106. The above-described bumping process requires a lot of substrate handling steps which may also be carried out by robots.

In a final inspection step, the reflowed bumps 106 are inspected to detect defective bump structures. The inspection process may be performed in the bumping section or the substrate may be transferred to a separate inspection station. Typically, substrate-handling robots are employed to handle the substrates 102.

The bumped substrate 102 is subsequently transferred to a test section and subjected to a functional test to detect defective die and to characterize the performance of the die formed on the substrate 102. The die may be tagged corresponding to the test results or the test results for each individual die of the substrate 102 may be transferred to the assembly section so that the die may be sorted according to the results of the test. The test is typically performed by means of auto-prober tools including wafer-handling robots.

After testing, the substrate 102 may be again transferred to the reflow section to heal damage caused by the pins of the probe cards. Prior to the reflow step, the substrate 102 may be subjected to a cleaning process. Performing the bump reflow completes the manufacturing process on substrate level and the substrate 102 is transferred to the assembly section.

The substrate 102 is diced to form individual die which may be sorted, for example, according to the result of the above-described substrate-level functional test. The resulting individual bare die are ready to be utilized in any flip-chip application not requiring thinned die.

Figure 1B:
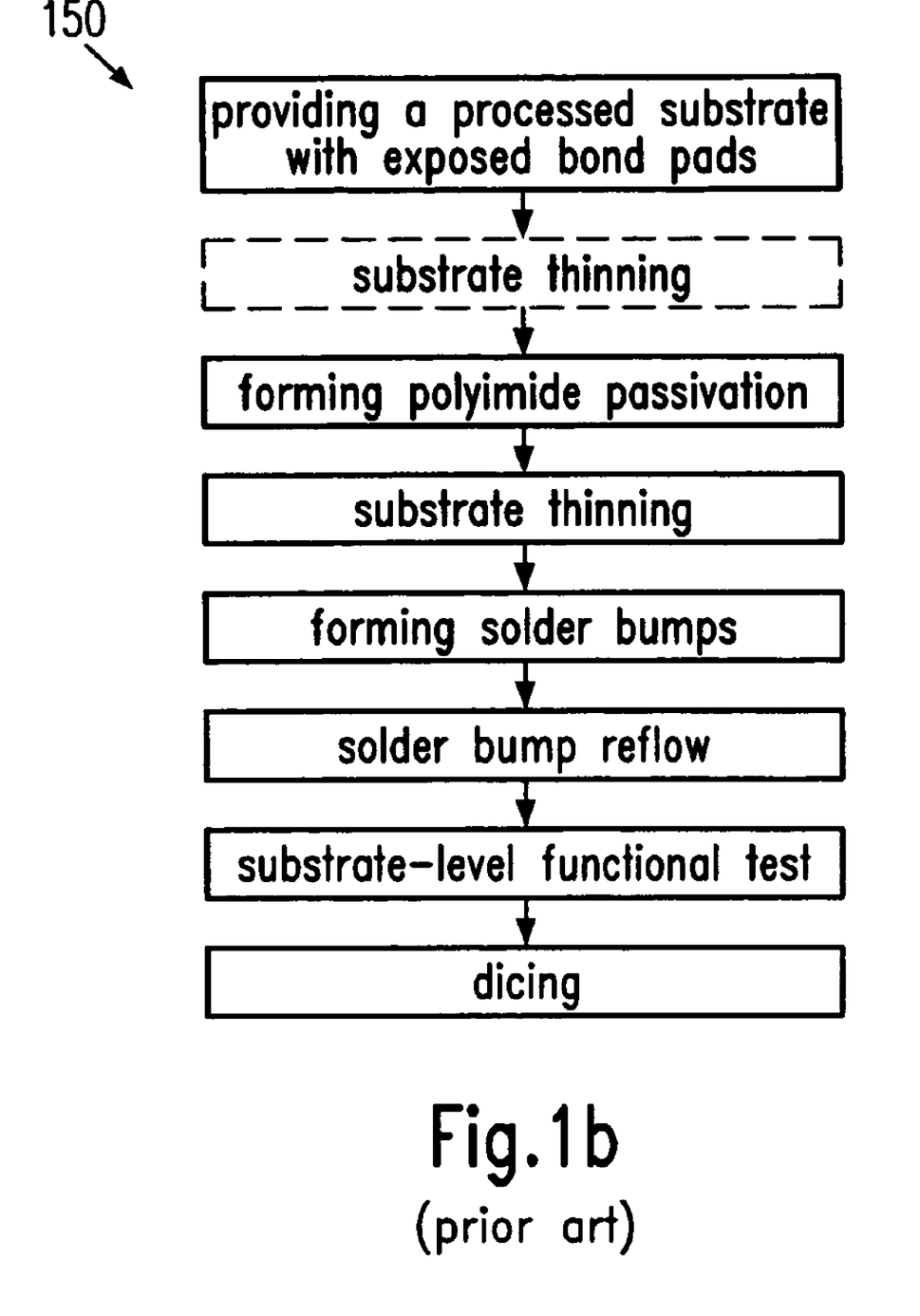

To produce thinned die, however, a substrate thinning process is integrated into the above-described bumping process sequence. In principle, the thinning process may be included at any bumping process step, i.e., before or after each individual process step of the polyimide passivation process, solder bumping process, reflow process, wafer-level functional test, or dicing since the substrate handling/transferring equipment may be adapted for handling of thinned substrates 102. Handling/transferring of thinned substrates 102, however, even with adapted equipment, increases the risk of breakage of the substrate 102. Additionally, the adaptation of the equipment increases the manufacturing costs. Therefrom, it is suggested to perform the thinning process after dicing to avoid handling/transferring of thinned substrates 102. Thinning of individual die, however, is a cost- and time-consuming operation that does, in addition, not meet the desired thickness uniformity requirements. Furthermore, the substrate thinning process impairs the solder bumps 106, in particular when a grinding method is employed, even when the bumped side is laminated by a conventional bump protection tape 104. For some applications, depending on the employed solder bump material, for example, for microprocessor applications comprising typically solder bump materials with high lead content (greater than 90%), the damage is, in general, unacceptably high and leads to high yield loss. Deposition of an additional protection layer to entirely embed the formed solder bumps 106, for example, by means of spin-coat deposition, is time- and cost-consuming and bears the risk of adversely affecting the bumped substrate 102, for example, by inducing thermal stress or by contamination. As a consequence, the thinning process is, according to the prior art, performed on substrate-level prior to the formation of the solder bumps 106 as illustrated by the process sequence 150 of FIG. 1b. Consequently, backside grinding is performed before or after the polyimide application, although the high risk of breakage of the thinned substrates 102 during the huge number of processing and handling steps, and the demand for special handling/transferring equipment for thinned substrates 102 in the bumping, reflowing, testing and dicing processes, reduces the cost-effectiveness of the process.

In view of the above-mentioned problems, there exists a need for an improved process sequence for thinning of substrates bearing die for flip-chip mounting.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment of the present invention, a method of thinning of a processed semiconductor substrate is provided. The method comprises providing a semiconductor substrate having formed thereon a plurality of exposed contact pads and forming solder bumps over the plurality of contact pads. The method further comprises reducing the thickness of the bumped substrate and performing a solder reflow process after thinning of the substrate.

BRIEF DESCRIPTION OF THE DRAWINGS

The invention may be understood by reference to the following description taken in conjunction with the accompanying drawings, in which like reference numerals identify like elements, and in which:

FIG. 1a depicts a bumped substrate and FIG. 1b a process flow of a solder bumping process and a substrate thinning process according to the prior art;

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to FIGS. 2, 3 and 4a-4j, further illustrative embodiments of the present invention will now be described in more detail, wherein, in FIGS. 4a-4j, similar or identical features are denoted by the same reference numerals as in FIG. 1a.

Figure 2:
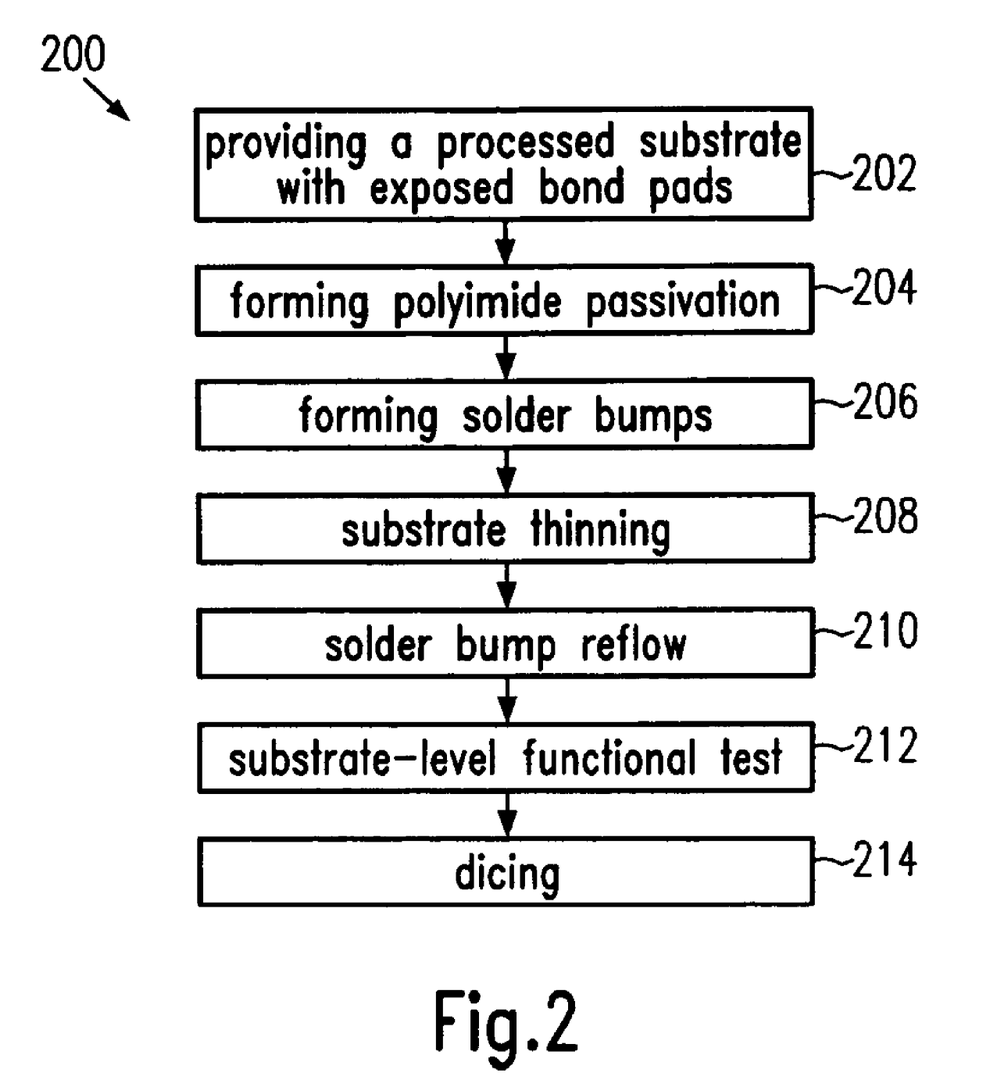
FIG. 2 depicts a corresponding process flow according to the present invention.

FIG. 2 depicts a process flow 200 of a method of forming thin die having solder bumps 106 formed thereon, for example, for flip-chip applications. A processed substrate 102 from the wafer facility is transferred to the bumping facility, as indicated in block 202. As a next step 204, a polyimide passivation layer 116 is deposited and patterned according to well-known polyimide processes. Reference number 206 relates to a subsequent solder bump formation process. The solder bumps 106 may be formed by selective deposition that may be achieved by deposition through mask or stencil openings or by electroless plating that may have an inherent selectivity characteristic depending on the participating materials. After solder bump material deposition, the substrate 102 is thinned, as indicated in the step 208, for example, by mechanical, chemical or chemical-mechanical techniques which are well-established in the conventional semiconductor manufacturing processes and are succinctly described in the prior art section. Since the thinning process is integrated at a rather late stage in the bumping process sequence, the handling of thin substrates 102 and, thus, the risk of breakage of the thinned substrate 102, is reduced. After the substrate thinning process, the substrate 102 is subjected to a conventional solder bump reflow process, as indicated in block 210, in a temperature range of approximately 150-400° C. depending on the participating solder materials. Thereby, damage of the solder bumps caused by the substrate thinning process, for example, when a backside grinding process is used, may be healed so that the subsequently performed substrate-level functional test 212 may be reliably carried out due to the high bump uniformity re-established in the prior reflow process. After the test, the substrate 102 may be diced, as indicated in step 214, to obtain individual thin die provided with solder bumps 106 so that the die are ready for flip-chip packaging.

Figure 3:
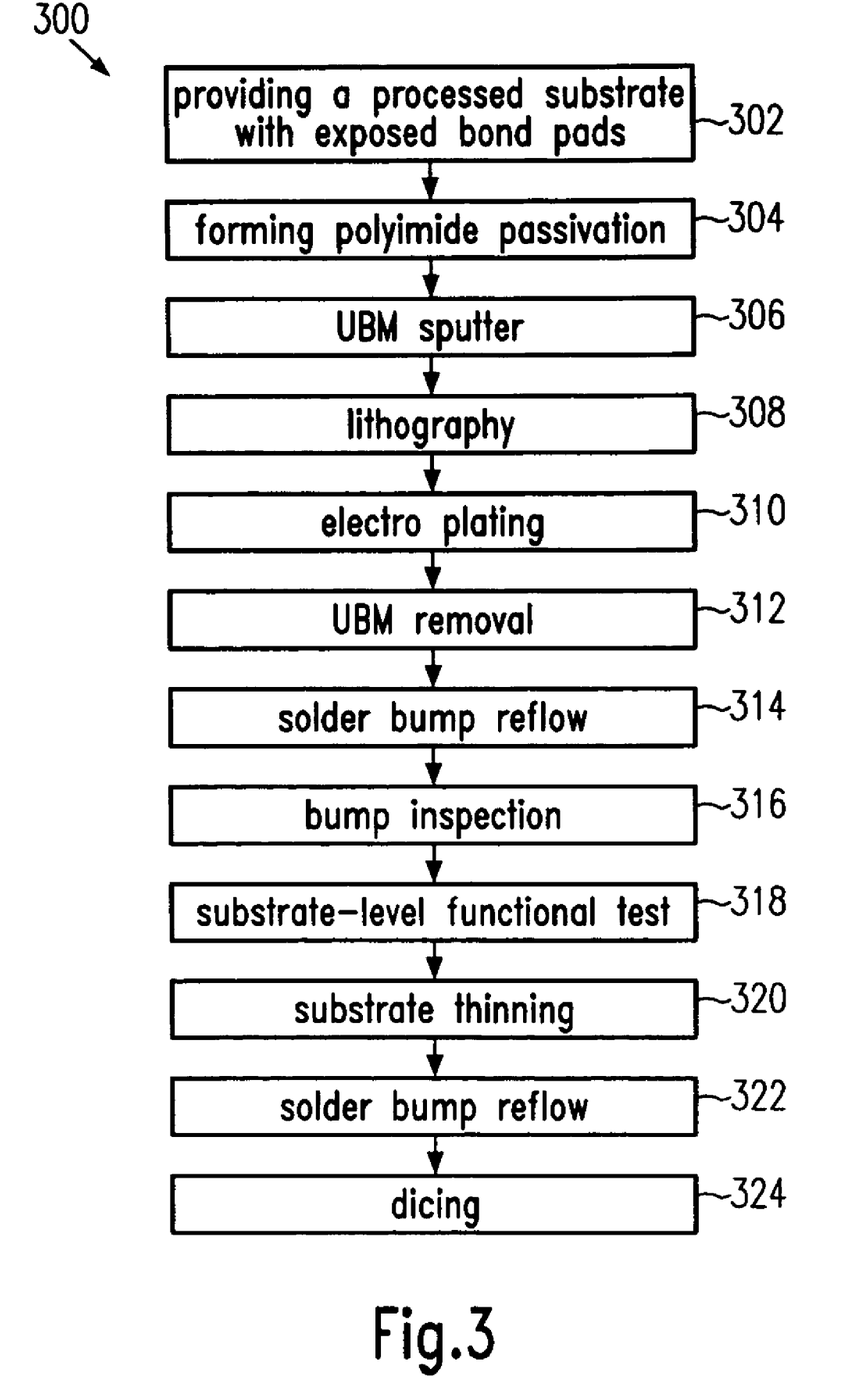
FIG. 3 depicts a detailed process flow of an electroplating bumping process according to the present invention.

FIG. 3 relates to a further embodiment of the present invention, wherein an electro-plating process is employed to deposit the solder bump material. The corresponding individual process steps are illustrated in FIGS. 4a-4j. The method of the present invention may be readily integrated into the standard process sequence of the solder bump electroplating process. Contrary to the evaporation technique, the mask 122 (FIG. 4c) defining the position and shape of the solder bump 106 as plated is formed by photolithography so that finer bump structures can be achieved. The processed substrate 102 with exposed bond pads 114 and a primary passivation 132 is subjected to the polyimide process as indicated in block 304 and illustrated in FIG. 4a to form a passivation layer 116 having openings to expose the bond pads 114. The openings are formed with a gentle sidewall slope to achieve a sufficient sidewall deposition in the subsequent under-bump metallization (UBM) layer 112 sputter process, as set forth in block 306 and illustrated in FIG. 4b. The sputtered UBM layer 112 comprises, for example, a TiW/Cu, Ti/Cu/Ni or TiW/CrCu/Cu sequentially sputtered layer stack to provide the desired adhesion, barrier and protection properties. The UBM layer 112 is not limited to the specified materials but other materials such as, for example, nickel, vanadium, bismuth, or alloys of the specified metals may be utilized. Additionally, the UBM layer 112 serves as a current distribution layer in the later electroplating process 310.

Figure 4A:
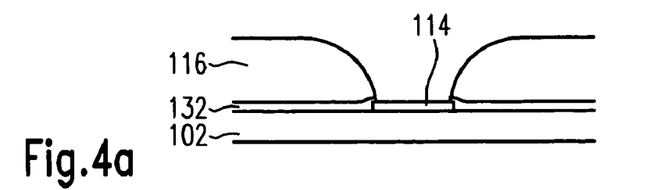
FIGS. 4a-4j depict the individual process steps of the process sequence shown in FIG. 3.
Figure 4B:
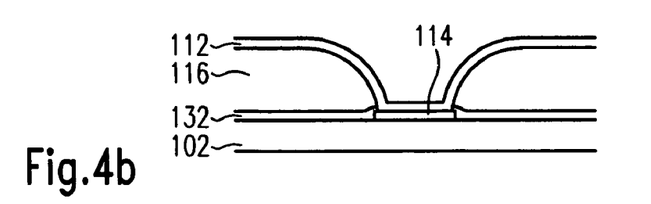
Figure 4C:
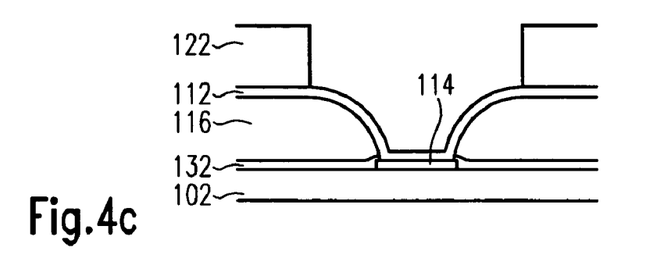

After sputtering, a mask 122 is formed on the UBM layer 112 by conventional resist photolithography, as indicated in step 308 and shown in FIG. 4c, to define the position and the shape of the solder bumps as plated. The thickness of the resist layer forming the mask may be chosen to be greater than the solder bump height as plated so that the solder bumps are plated completely in the mask opening with straight sidewalls. On the other hand, the thickness of the resist layer may be chosen to be less than the solder bump height resulting in so-called "mushroom" bumps 124 due to the selective and non-directed growth of the upper portion of the bumps. In this case, the consumption of resist and developer material and the process time may be reduced.

Figure 4D:
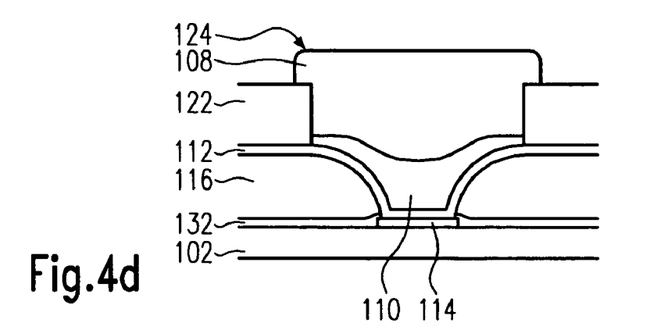

After lithography, the substrate 102 is subjected to the electroplating process, as set forth in block 310 and shown in FIG. 4d, forming the solder bumps, for example, in a single-substrate fountain plating system. The solder bump materials, typically lead and tin, may be deposited in a common process defining the mixing ratio by the bath composition or in a sequential process defining the mixing ratio by the ratio of the plating times of the two components. The ratio of the plating times, in general, is not equal to the mixing ratio of the deposited alloy since the employed materials may have a rather different deposition characteristic depending, for example, on the employed chemistries. The sequentially deposited materials form the desired alloy in the subsequent reflow process. The process with a high geometrical and composition uniformity (approximately ±4 μm and ±1% by weight, respectively) may be employed to plate solder bumps 106 which allow formation of a reliable mechanical, thermal and electrical connection to the die-carrier. For microprocessor applications, typically, high leaded solder having a lead contingent of more than 90%, for example, 95% or even 97% is used. The current density during plating is carefully controlled to ensure a constant plating rate, even in the "mushroom" plating phase, since the bump uniformity depends on the plating rate. High-lead solder (95% lead), for example, is typically plated at a rate of 3-5 μm per minute. The plating process may comprise an additional deposition step, wherein prior to the solder materials of the solder portion 108 a stud structure is deposited on the UBM layer 112 to form an extended base structure 110 for the solder bump 106. The stud portion of the solder bump 106, for example, may comprise nickel or copper.

Figure 4E:
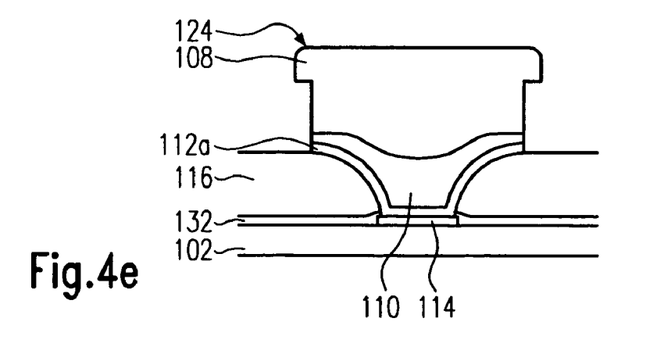

After completion of the plating process, the UBM removal process is carried out, as set forth in block 312 and shown in FIG. 4e. After removing the resist mask layer 122, the exposed UBM layer 112 may be removed, for example, by a wet etch to separate the solder bumps 106 electrically. The chosen etch chemistry depends on the employed materials and may be changed during the etch process to account for the etch characteristic of the employed UBM sub-layers. Typically, etch chemistries having a certain etch selectivity to the solder bump material is employed, but due to the minor thickness of the UBM sub-layers, selectivity is not a major concern. Corresponding etch chemistries for the UBM sub-layer materials are well known in the semiconductor industry and, hence, are herein not further described.

Figure 4F:
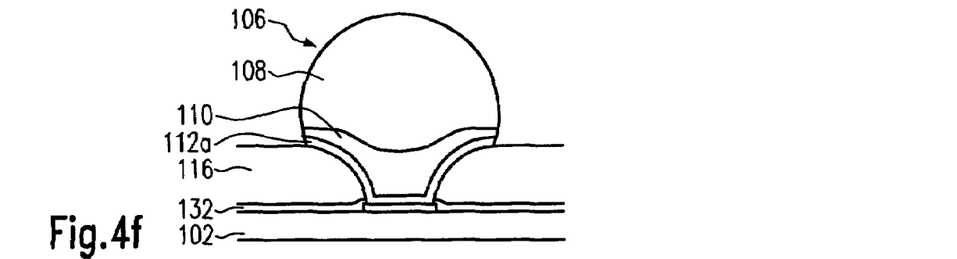

In the subsequent reflow process, indicated in block 314 and shown in FIG. 4f, the solder bump material deposited in the plating process, indicated in block 310, is reflowed at a temperature in the range of approximately 150-400° C. depending on the employed solder bump material. High lead solder bump compositions, in general, need higher reflow temperatures so that, in the above-mentioned case of a lead content of greater than 90%, reflow temperatures at a range of approximately 250-400° C. are required. The reflow process, for example, may be performed in a programmable oven or furnace having, for example, resistive heater or IR lamps. The reflow process typically lasts for approximately 10-200 seconds to improve the alloy uniformity, in particular, for sequentially deposited solder bump materials, and to diffuse solder bump material into the UBM layer 112a to form intermetallic compounds to provide solder bumps 106 with high mechanical toughness.

Figure 4G:
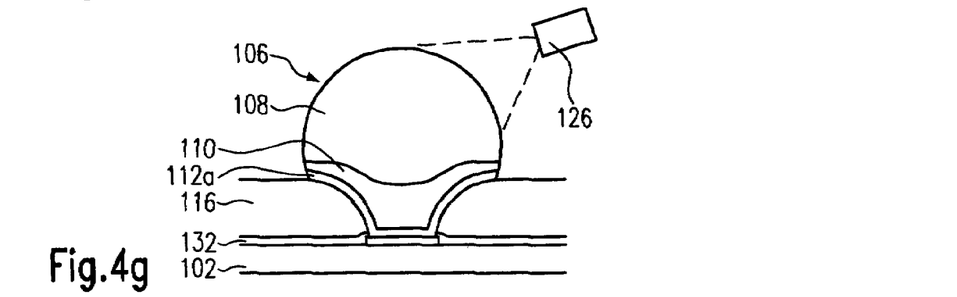
Figure 4H:
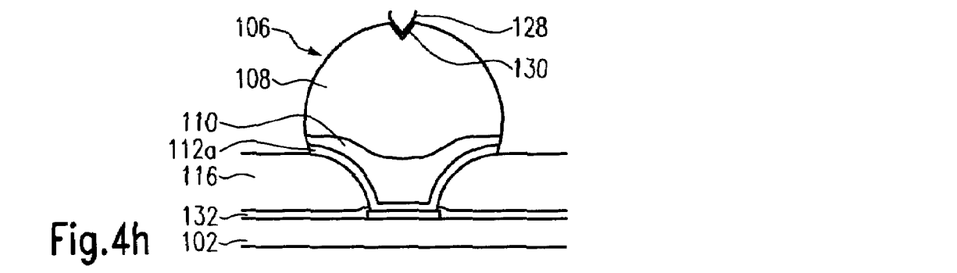

After the reflow process, the substrate 102 is subjected to a bump inspection process, indicated in block 316 and shown in FIG. 4g, to check and analyze the solder bump geometry of the bumps 106. Visual microscopy and/or digital image analyzing methods using optical microscopes 126 are employed to perform the bump inspection reliably. While visual methods provide a quick overview of the bump state, the digital image analysis provides, in view of the high bump counts per die/substrate, the more reliable method. After bump inspection, the substrate 102 is transferred to the substrate die sort facility for substrate level functional testing, as indicated in block 318 and shown in FIG. 4h. Typically, auto-prober tools are employed to perform a functional test of the die circuit on the substrate level as described in the prior art section. The pins 128 of the probe card may cause probe marks 130 on the bumps 106.

Figures 4I, 4J:
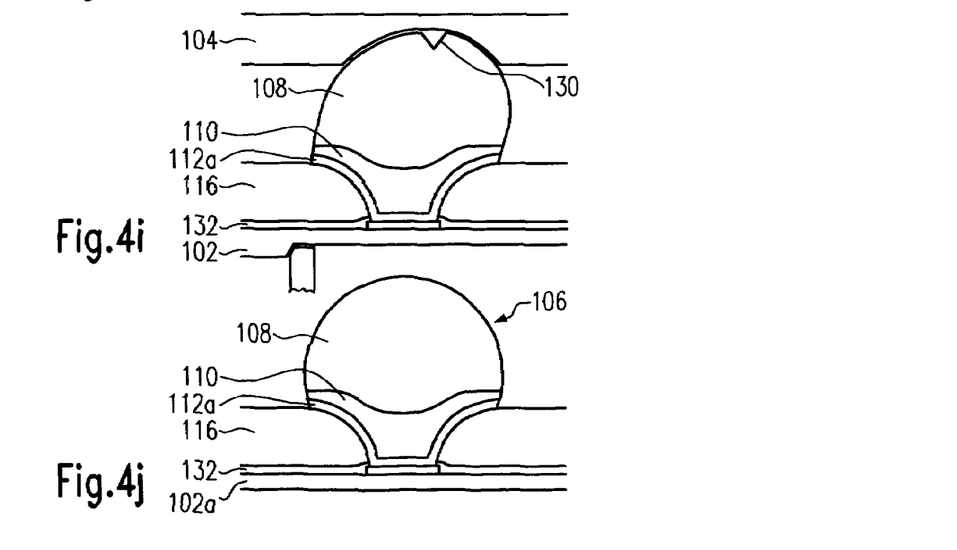

After the sort process, the substrate thinning process is performed, as set forth at block 320 and shown in FIG. 4i. A bump protection tape 104 is laminated onto the bumped surface of the substrate 102 to protect the solder bumps 106 during the thinning process. The substrate 102 is thinned by removing material from the substrate backside by any available technique, for example, by mechanical, chemical or chemical/mechanical techniques like grinding, dry polishing, etching and chemical mechanical polishing (CMP). Typically, the substrate 102 is thinned by coarse and fine grinding and subsequently a dry polishing, CMP, or a wet etch, typically a spin-etch, is carried out to remove the damaged backside sub-layer which is formed during grinding. Removing the damaged sub-layer increases the strength of the thinned die and may reduce the thermal contact resistance since the surface roughness may also be reduced. The reduction of the thermal contact resistance may be relevant, when a heat sink is attached to the backside of a high power die, in particular, when a dry thermal contact is employed. When, on the other hand, no particular die strength or thermal contact resistance is required, the final polishing or etch step may be omitted. Depending on the desired application, the final thickness of the substrate 102a may be in the range of approximately 20-500 μm. For microprocessor applications, for example, the final thickness is typically in the range of approximately 200-500 μm.

After completion of the substrate thinning process, the protection tape 104 is delaminated from the front side of the substrate 102a. Subsequently, the substrate 102a is subjected to a reflow process, as indicated in step 322 and shown in FIG. 4j, so that the damage caused to the solder bumps 106 in the sort and in the thinning process may be healed. In particular, for high lead solder materials with a lead content of grater than 90%, the caused bump damage may substantially be healed. The solder reflow process is performed at a temperature in the range of approximately 200-400° C. and lasts for approximately 10-200 seconds to raise the temperature of the solder above the melting temperature of the solder material. Since a reflow is typically performed after the sort process to heal the damage caused by the pins of the probe cards, no additional reflow process is required to heal the damage caused by substrate thinning. After the reflow, the substrate 102a can be transferred to the assembly facility where the substrate 102 may be cut into individual, thinned die, as indicated in block 324, that are ready for any flip-chip application.

The integration of the substrate thinning process into the electroplating process according to the present invention allows manufacturing of thinned die comprising solder bumps 106 having excellent uniformity and a low pitch so that future flip-chip requirements may be met, while the risk of substrate breakage is low since the number of handling steps of thinned wafers is low.

In another embodiment, the substrate thinning process may be performed prior to the bump inspection process 316 so that the conventional bump inspection may additionally be employed to monitor the thinning process with respect to solder bump damage. Thus, the substrate thinning process may be monitored without introducing additional inspection processes.

In a further embodiment, the substrate thinning process 320 may be performed as indicated in FIG. 3 but the bump inspection process 316 may be performed after the substrate thinning process 320. Thus, the thinning process may be again monitored by the bump inspection while, on the other hand, the number of handling steps of the thinned wafer may be reduced.

In yet another embodiment, a cleaning step (not shown) may be performed before the reflow process 322. Hence, residuals formed in the sort process by the probe card pins, during substrate handling and/or in the substrate grinding process may be removed in a single cleaning step. Thereto conventionally performed pre-reflow cleaning processes may be used to increase the cost effectiveness.

In a further embodiment, the substrate thinning process is integrated into a stencil-based solder bumping process (not shown) so that no resist mask is to form on the substrate 102. The method is applicable for substrates 102 having aluminum bond pads 114. As a first step, the aluminum area is cleaned and the adherent oxides are removed. Then, the aluminum is activated by a thin layer (not shown) of zinc or palladium. Subsequently, nickel (not shown) is electroless plated on the activated aluminum area by immersing the substrate 102 into an ammonia-based phosphorous chemistry. As a next step, a thin gold protection layer (not shown) is deposited, for example, by immersing into a cyanide chemistry. Subsequently, the solder deposition is performed by stencil-based deposition. After a first reflow of the deposited solder bump material, the substrate 102 may be transferred to a bump inspection station. Subsequently, the substrate thinning is performed as described above before a second solder reflow is carried out.

Advantageously, the method provides an economic and reliable process for large scale production of thinned, bumped die, in particular, for applications having a moderate bump pitch.

As a result, the present invention provides a method for enhancing the substrate thinning process. The substrate thinning is performed after bumping and before a conventional solder bump reflow process to reduce the number of handling steps performed with the thinned substrate 102 and to allow healing of the damage of the solder bumps 106 caused in the substrate thinning process in the conventional reflow processes so that no additional reflow process is required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor substrate having formed thereon a plurality of exposed contact pads;
   performing at least a first reflow process to form solder bumps over said plurality of contact pads;
   after performing said first reflow process, reducing a thickness of the substrate having the solder bumps formed thereon; and
   performing a second solder reflow process after performing a thinning process to thin said substrate, wherein said second solder reflow process is employed to heal mechanical damage to said solder bumps during one of a functional testing process and said substrate thinning process.

2. The method of claim 1, wherein reducing the thickness of the bumped substrate comprises grinding the backside of the substrate.

3. The method of claim 1, wherein reducing the thickness of the bumped substrate further comprises:
   laminating a protection tape on the bumped surface of the substrate before reducing the thickness; and
   delaminating the protection tape from the substrate after reducing the thickness.

4. The method of claim 3, wherein the substrate is subjected to a cleaning process after delaminating the protection tape.

5. The method of claim 2, further comprising inspecting the bumps to detect defective bumps.

6. The method of claim 5, wherein inspecting the bumps is performed after grinding the backside of the substrate.

7. The method of claim 2, wherein said functional testing process comprises connecting the plurality of contact pads to a plurality of integrated circuits formed on and in the substrate and testing the plurality of integrated circuits.

8. The method of claim 7, wherein said functional testing process is performed after grinding the backside of the bumped substrate.

9. The method of claim 1, further comprising forming a patterned passivation layer over the substrate exposing at least partially the plurality of contact pads.

10. The method of claim 9, wherein the passivation layer comprises polyimide.

11. The method of claim 1, wherein forming solder bumps comprises:
    depositing an under bump metal layer;
    masking the substrate to define a bump metal deposition pattern; and
    depositing the bump metal.

12. The method of claim 11, wherein the under bump metal layer is deposited by at least one of a sputter process and an evaporation process.

13. The method of claim 11, wherein the under bump metal layer comprises a layer stack comprising at least one of an adhesion layer and a barrier layer.

14. The method of claim 11, wherein masking the substrate comprises:
    depositing a photoresist layer; and
    patterning the photoresist layer by photolithography to expose the under bump metal layer at least partially over the plurality of contact pads.

15. The method of claim 11, wherein the bump metal is deposited by at least one of a plating process and an evaporation process.

16. The method of claim 15, wherein the plating process is performed by at least one of an electroplating and an electroless plating.

17. The method of claim 1, wherein the solder bumps comprise a solder portion comprising lead and tin.

18. The method of claim 17, wherein the solder portion of the solder bumps comprise at least 90% lead.

19. The method of claim 17, wherein the solder bumps further comprise a base portion comprising a different material having a higher melting temperature than the solder portion material.

20. The method of claim 19, wherein the material of the base portion comprises at least one of nickel, gold and copper.

21. The method of claim 11, further comprising removing the exposed portion of the under bump metal layer after bump metal deposition.

22. The method of claim 2, further comprising subjecting the substrate to a cleaning process before grinding the backside of the substrate.

* * * * *